(12) United States Patent
Enomoto et al.

(10) Patent No.: US 7,088,217 B2
(45) Date of Patent: Aug. 8, 2006

(54) SHUNT RESISTANCE AND METHOD OF ADJUSTING THE SHUNT RESISTANCE

(75) Inventors: Hideki Enomoto, Osaka (JP); Riichi Uotome, Osaka (JP); Narutoshi Hoshino, Osaka (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 10/332,898

(22) PCT Filed: Jan. 10, 2002

(86) PCT No.: PCT/JP02/00105

§ 371 (c)(1), (2), (4) Date: Jan. 15, 2003

(87) PCT Pub. No.: WO02/056320

PCT Pub. Date: Jul. 18, 2002

(65) Prior Publication Data

US 2003/0146077 A1 Aug. 7, 2003

(30) Foreign Application Priority Data

Jan. 15, 2001 (JP) .............................. 2001-006728

(51) Int. Cl.
*H01C 7/00* (2006.01)

(52) U.S. Cl. .................... 338/49; 338/307; 338/309

(58) Field of Classification Search .................. 338/49, 338/206, 323, 324, 325, 329, 338, 308, 309, 338/307

See application file for complete search history.

(56) References Cited

U.S. PATENT DOCUMENTS

| 859,255 | A | * | 7/1907 | Roller .......................... 338/49 |
| 892,554 | A | * | 7/1908 | Roller .......................... 338/49 |
| 1,050,563 | A | * | 1/1913 | Roller .......................... 338/49 |
| 1,084,721 | A | * | 1/1914 | Willis ......................... 324/126 |
| 1,100,708 | A | * | 6/1914 | Brooks .......................... 338/49 |
| 2,407,251 | A | * | 9/1946 | Christensen ................ 338/325 |
| 2,518,941 | A | * | 8/1950 | Satchwell et al. .......... 337/107 |
| 3,245,021 | A | * | 4/1966 | Kernander et al. ........... 338/49 |
| 4,494,068 | A | * | 1/1985 | Ley et al. .................... 324/126 |

(Continued)

FOREIGN PATENT DOCUMENTS

JP 2-265204 * 10/1990 ................. 338/322

(Continued)

*Primary Examiner*—Tu Hoang
(74) *Attorney, Agent, or Firm*—Oblon, Spivak, McClelland, Maier & Neustadt, P.C.

(57) ABSTRACT

A shunt resistor of the present invention has a configuration including a substantially planar resistor (10) having a predetermined resistance value; a first fixed terminal plate (20) that has one end portion (21) connected to an edge of the resistor (10); and a second fixed terminal plate (30) that has one end portion (31) connected to the other edge of the resistor (10), that has a portion in the vicinity of the end portion (31) which is bent substantially in the shape of the letter "U", and that opposes at least a portion of the first fixed terminal plate (20), wherein a plurality of terminal tabs (12) for taking a voltage drop in the resistor (10) as a voltage signal is provided protrusive from a side edge of the resistor (10), and lead wires (40) are connected to the terminal tabs (12). This configuration eliminates a conventional structural restriction requiring portions in the direction of to the sidewall of the resistor 10 to be open, and consequently, enables the degree of freedom in design to be enhanced.

6 Claims, 10 Drawing Sheets

U.S. PATENT DOCUMENTS

| | | | |
|---|---|---|---|
| 4,580,095 A | * | 4/1986 | De Vries .................... 324/126 |
| 4,794,326 A | * | 12/1988 | Friedl ..................... 324/117 R |
| 5,214,407 A | * | 5/1993 | McKim et al. ............... 338/49 |
| 5,896,077 A | * | 4/1999 | Cadwallader ............... 336/192 |
| 5,999,085 A | * | 12/1999 | Szwarc et al. .............. 338/309 |
| 6,078,028 A | * | 6/2000 | Cooper et al. .............. 219/270 |
| 6,489,881 B1 | * | 12/2002 | Aleksandravicius et al. ......................... 338/307 |
| 6,677,850 B1 | * | 1/2004 | Dames ....................... 338/307 |

FOREIGN PATENT DOCUMENTS

JP   11-97203   4/1999

* cited by examiner

SHUNT RESISTANCE AND METHOD OF ADJUSTING THE SHUNT RESISTANCE

TECHNICAL FIELD

The present invention relates to a shunt resistor and a resistance-value adjusting method thereof.

BACKGROUND ART

In general, an electric current, such as a pulsed current or a high alternate current, is measured in a manner that a measurement-target current is applied to flow through a shunt resistor having a known resistance value, and a voltage drop occurring in the shunt resistor is measured. The applicant already proposed a shunt resistor of the aforementioned type, as shown in FIG. 11 (refer to Japanese Unexamined Patent Application Publication No. 2000-131349). The conventional shunt resistor disclosed in the publication is configured such that two substantially planar resistors 6a and 6b are connected together at their one-side edges substantially to form the letter "U". One-side ends of substantially L-shaped fixed plates 2a and 2b are connected to the other-side edges of the respective resistors 6a and 6b. In addition, a pair of lead wires 40 and 40 are individually connected by spot welding or a like manner to the vicinities of connection portions to the fixed terminal plate; 2a and 2b fixed to the individual resistors 6a and 6b, in which the lead wires 40 and 40 individually take a voltage drop, which occurs with the resistors 6a and 6b, in the form of a voltage signal when a measurement-target current is applied to the shunt resistor through the fixed terminal plates 2a and 2b.

According to above-described the conventional example, however, the lead wires 40 and 40 are connected to surfaces of the individual resistors 6a and 6b, and hence the lead wires 40 and 40 are extended in the directions of sidewalls of the resistors 6a and 6b facing the fixed terminal plates 2a and 2b. As such, the configuration is restricted in that portions in the directions of the sidewalls of the resistors 6a and 6b must be kept open, therefore arising the problem of reducing the degree of freedom in design. For example, in case of providing the fixed terminal plates 2a and 2b on a heat-dissipating plate, lead wires 40 and 40 extended in the direction of the sidewalls of resistors 6a and 6b become hindrances, there occurs a problem that a shape of the heat-dissipating plate is complicated or it is grown in size in order to avoid lead wires 40 and 40.

The present invention is made in view of the above-described problems. Accordingly, an object of the invention is to provide a shunt resistor that eliminates the structural restriction and enables the degree of freedom in design to be enhanced.

Another object of the present invention is to provide a resistance-value adjusting method for the shunt resistor to enable the resistance value of a resistor to easily be adjusted.

DISCLOSURE OF INVENTION

A shunt resistor as defined in claim 1 of the present invention has a configuration including a substantially planar resistor having a predetermined resistance value; a first fixed terminal plate that has one end portion connected to an edge of the resistor; and a second fixed terminal plate that has one end portion connected to the other edge of the resistor, that has a portion in the vicinity of the end portion which is bent substantially in the shape of the letter "U", and that opposes the resistor and at least a portion of the first fixed terminal plate, wherein a plurality of terminal tabs for taking a voltage drop in the resistor as a voltage signal is provided protrusive from a side edge of the resistor.

According to the shunt resistor having the above-described configuration, since the terminal tabs are provided protrusive from the side edge of the resistor, even in a case where, for example, a lead wire is connected to each of the terminal tabs, the lead wire can be extended in a direction different from the direction of a sidewall of the resistor; and accordingly, the structural restriction can be eliminated, and the degree of freedom in design can therefore be enhanced.

A shunt resistor as defined in claim 2 of the present invention has a configuration including a substantially planar resistor having a predetermined resistance value; a first fixed terminal plate that has one end portion connected to an edge of the resistor; and a second fixed terminal plate that has one end portion connected to the other edge of the resistor and that opposes the resistor and at least a portion of the first fixed terminal plate, wherein a plurality of terminal tabs for taking a voltage drop in the resistor as a voltage signal is provided protrusive from a side edge of the resistor.

According to the shunt resistor having the above-described configuration, since the terminal tabs are provided protrusive from the side edge of the resistor, even in a case where, for example, a lead wire is connected to each of the terminal tabs, the lead wire can be extended in a direction different from the direction of a sidewall of the resistor; and accordingly, the structural restriction can be eliminated, and the degree of freedom in design can be enhanced. Further, since the clearance between the resistor and the second fixed terminal plate can be narrowed, the inductance component can be reduced, and detection errors of the measurement-target current can consequently be reduced.

The above and other relevant objects and features of the present invention will become more clear from description given below with reference to the accompanying drawings.

BRIEF DESCRIPTION OF THE DRAWINGS

FIG. 11 is a side view showing a conventional example.

BEST MODE FOR CARRYING OUT THE INVENTION

Embodiment 1

Figure 1:
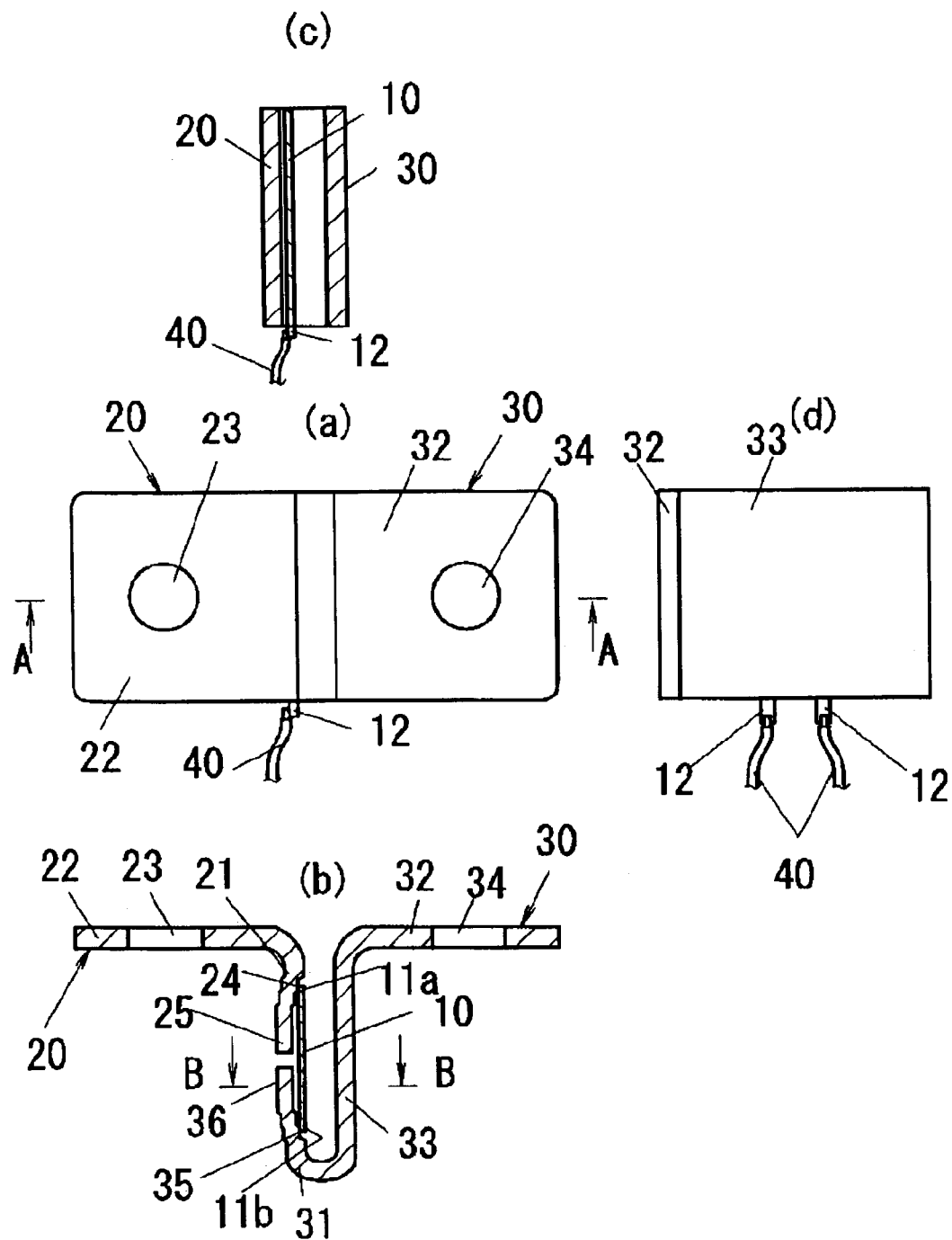
FIG. 1 shows embodiment 1 of the present invention, wherein (a) is a plan view thereof, (b) is a cross-sectional view along the line A—A of (a), (c) is a cross-sectional view along the line B—B of (b), and (d) is a side view thereof.

Hereinbelow, embodiment 1 of the invention will be described with reference to FIGS. 1 and 2. Referring to FIG. 1, a shunt resistor of the present embodiment includes a substantially planar resistor 10 having a predetermined resistance value; a first fixed terminal plate 20 that an end portion 21 on the one side is connected to one edge of the resistor 10; a second fixed terminal plate 30 that has an other-side end portion 31 which is connected to the opposing edge of the resistor 10, to have a portion in the vicinity of the end portion 31 which is bent substantially in the shape of the letter "U", and to oppose the resistor 10 and at least a portion of the first fixed terminal plate 20; and a pair of lead wires 40 and 40 individually connected to the resistor 10 to take a voltage drop in the resistor 10 as a voltage signal.

Figure 2:
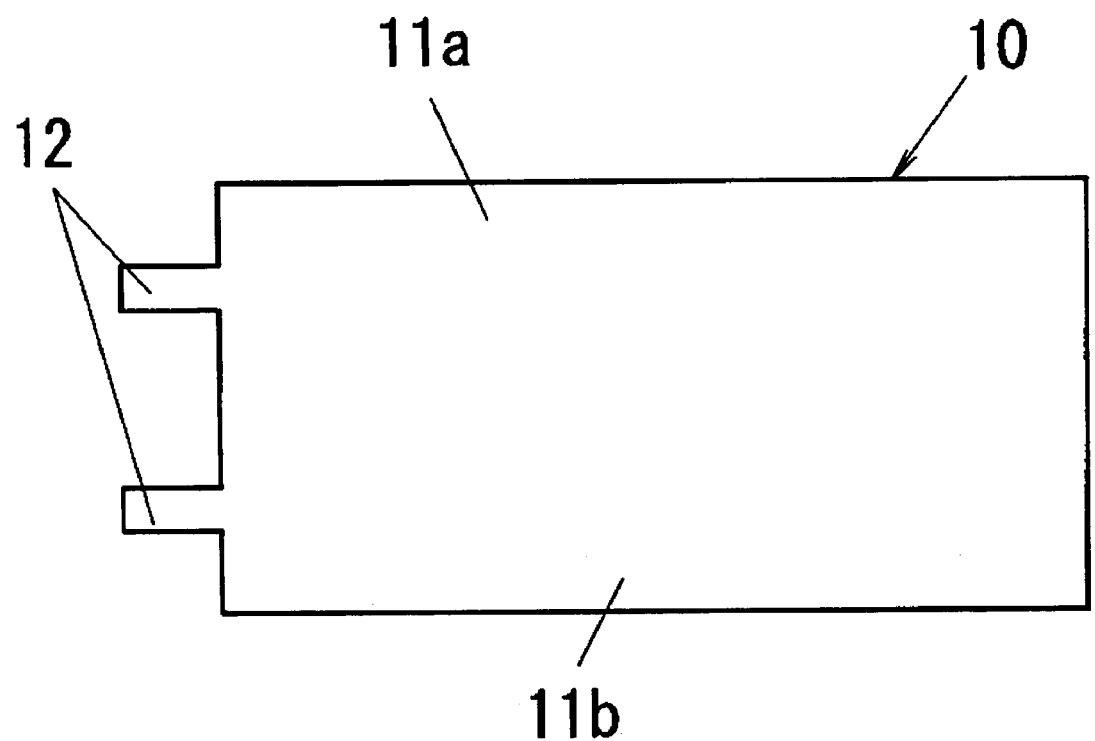
FIG. 2 is a plan view of a resistor in the above.

Referring to FIG. 2, the resistor 10 is formed of, for example, a copper-manganese alloy or a copper-nickel alloy, as a lengthy rectangular plate. The end portions 21 and 31 of the first and second fixed terminal plates 20 and 30 are braze-welded to two longitudinal edge portions 11a and 11b, respectively. In addition, a pair of terminals 12 and 12 to which the individual lead wires 40 and 40 are connected are integrally formed along the longitudinal direction of the resistor 10 to protrude from one side edge opposing the longitudinal direction of the resistor 10. Generally, in current measurement using the shunt resistor, the current value is obtained from a voltage drop occurring when a measurement-target current is applied to the resistor 10, and therefore, the resistance value of the resistor 10 needs to be adjusted substantially constant. On the other hand, the resistance value of the resistor 10 is unstabilized at the edge portions 11a and 11b that are connected to the respective first and second fixed terminal plates 20 and 30. Thus, in the present embodiment, the terminal tabs 12 and 12 formed protrusive from portions positioned inward of the two edge portions 11a and 11b of the resistor 10 to stabilize the resistance value.

Referring to FIG. 1, the first fixed terminal plate 20 is formed of an electroconductive metal material such as an electrolytic copper or an HSM (EF-TEC4). The terminal plate 20 is formed overall substantially in the shape of the letter "L" in a manner that a portion in the vicinity of the end portion 21 on the one side of a rectangularly-planar main portion 22 is bent substantially perpendicular thereto, and a circular insertion opening 23 is provided substantially in the center of the main portion 22 to allow a fixing screw (not shown) to be inserted. On the other hand, an indented portion 24 retractable toward the main portion 22 is provided on the face onto which the resistor 10 at the end portion 21 is connected. Moving the edge portion 11a of the resistor 10 to abut the indented portion 24 enables positioning of the edge portion 11a of the resistor 10 and the end portion 21 of the first fixed terminal plate 20. Furthermore, in a portion closer than the indented portion 24 to the end portion 21, a heat-dissipating plate 25 for dissipating heat generated by the resistor 10 is provided. The heat-dissipating plate 25 is formed integrally with the first fixed terminal plate 20 so as to move backward from the end of the edge portion 11a toward the main portion 22, thereby forming a clearance between itself and the resistor 10.

As shown in FIG. 1, in the second fixed terminal plate 30, a plate material made of an electroconductive metal material such as an electrolytic copper or an HSM (EF-TEC4) is bent substantially in the shape of the letter "L" to thereby integrally form a planar main portion 32 and a connection portion 33 that is substantially perpendicular to the main portion 32. In addition, an end portion of the connection portion 33 is bent substantially in the shape of the letter "U", thereby forming the end portion 31 that is connected to the resistor 10. Further, a circular insertion opening 34 is provided substantially in the center of the main portion 32 to allow a fixing screw (not shown). On the other hand, an indented portion 35 retractable away from the connection portion 33 is provided on the face onto which the resistor 10 at the end portion 31 is connected. Moving the edge portion 11b of the resistor 10 to abut the indented portion 35 enables positioning of the edge portion 11b of the resistor 10 and the end portion 31 of the second fixed terminal plate 30. Furthermore, in a portion closer than the indented portion 35 of the end portion 31, a heat-dissipating plate 36 for dissipating heat generated by the resistor 10 is provided. The heat-dissipating plate 36 is formed integrally with the second fixed terminal plate 30 so as to move back from the end of the edge portion 11b and the connection portion 33, thereby forming a clearance between itself and the resistor 10.

The shunt resistor of the present embodiment is assembled in the following steps. First, the resistance value of the resistor 10 is adjusted to a desired resistance value. Specifically, a known current is applied between the edge portions 11a and 11b of the resistor 10, and the resistance value is measured from the voltage between the terminal tabs 12 and 12 (voltage drop occurring in the resistor 10). The resistance value is adjusted by deleting a portion(s) where the terminal tabs 12 and 12 of the resistor 10 are not provided (the other-side edge opposing in the longitudinal direction of the resistor 10) so that the measured resistance value becomes a desired value. Thus, the resistance value can easily be adjusted only by deleting a portion(s) of the resistor 10.

Subsequently, the lead wires 40 and 40 are respectively connected to the terminal tabs 12 and 12 of the resistor 10 of which the resistance value has been adjusted. The terminal tabs 12 may be connected to the lead wires 40 by an appropriate method, such as soldering, laser welding, or resistance welding. The one-side edge portion 11a of the resistor 10 connected to the lead wire 40 is abutted on the indented portion 24 provided in the end portion 21 of the first fixed terminal plate 20 to perform positioning. Then, the edge portion 11a of the resistor 10 is soldered to the end portion 21 of the first fixed terminal plate 20. Subsequently, the other-side edge portion 11b of the resistor 10 is abutted on the indented portion 35 provided in the end portion 31 of the second fixed terminal plate 30 to perform positioning. Then, the edge portion 11b of the resistor 10 is soldered to the end portion 31 of the second fixed terminal plate 30. Subsequently, the connection portion 33 in the vicinity of the end portion 31 that is connected to the edge portion 11a of the resistor 10 is bent substantially in the shape of the letter "U", and thereby, the connection portion 33 of the second fixed terminal plate 30 is formed substantially to oppose in parallel to the resistor 10 and the end portion 21 of the first fixed terminal plate 20. According to the configuration in which the resistor 10 and the second fixed terminal plate 30 oppose each other, many magnetic fields caused by the measurement-target current flowing through the resistor 10 and the second fixed terminal plate 30 are mutually offset.

Inductance components of the shunt resistor are reduced and consequently, detection errors of the measurement-target current can be reduced.

The shunt resistor of the present embodiment has the configuration as described above. According to the configuration, since the terminal tabs 12 and 12 to which the lead wires 40 and 40 are connected are formed protrusive from the side edge of the resistor 10, the lead wires 40 and 40 can be extended in the directions different from those of the first and second fixed terminal plates 20 and 30. Consequently, the configuration avoids the conventional structural restriction that requires the portion in the directions of-sidewalls of the resistor 10 to be open, and therefore enabling the degree of freedom in design to be enhanced. In particular, in the present embodiment, the lead wire 40 is not extended in the direction of to the sidewall of the resistor 10 so that the configuration can be such that the connection portion 33 of the second fixed terminal plate 30 is bent substantially in the shape of the letter "U" to thereby narrow the clearance between the resistor 10 and the first fixed terminal plate 20. In addition, the lead wires 40 and 40 do not hinder the operation of providing the heat-dissipating plates 25 and 36 to the end portions 21 and 31 of the first and second fixed terminal plates 20 and 30 so that the first and second fixed terminal plates 20 and 30 need not be shaped complex in order to avoid the lead wires 40 and 40, therefore enabling miniaturization of the shunt resistor. In addition, the indented portions 25 and 36 for positioning are provided to the end portions 21 and 31, which function as connection portions to the resistor 10 for the first and second fixed terminal plates 20 and 30. Hence, the connection positions between the resistor 10 and the first and second fixed terminal plates 20 and 30 are stabilized, and variations in the resistance value can be suppressed. In addition, the heat-dissipating plates 25 and 36 are provided in the vicinity of the end portions 21 and 31, which function as the connection portions to the resistor 10 for the first and second fixed terminal plates 20 and 30. This arrangement enables efficient dissipation of heat generated in the resistor 10 through which the measurement-target current flows, and consequently enables a temperature rise to be suppressed. In the present embodiment, the lead wires 40 and 40 are first connected to the terminal tabs 12 and 12, and the resistor 10 is then connected to the first and second fixed terminal plates 20 and 30. However, to the contrary, the resistor 10 may be first connected to the first and second fixed terminal plates 20 and 30, and the lead wires 40 and 40 are then connected to the terminal tabs 12 and 12 of the resistor 10. Also, the steps of connecting the first and second fixed terminal plates 20 and 30 to the resistor 10 may be reversed.

Figure 3:
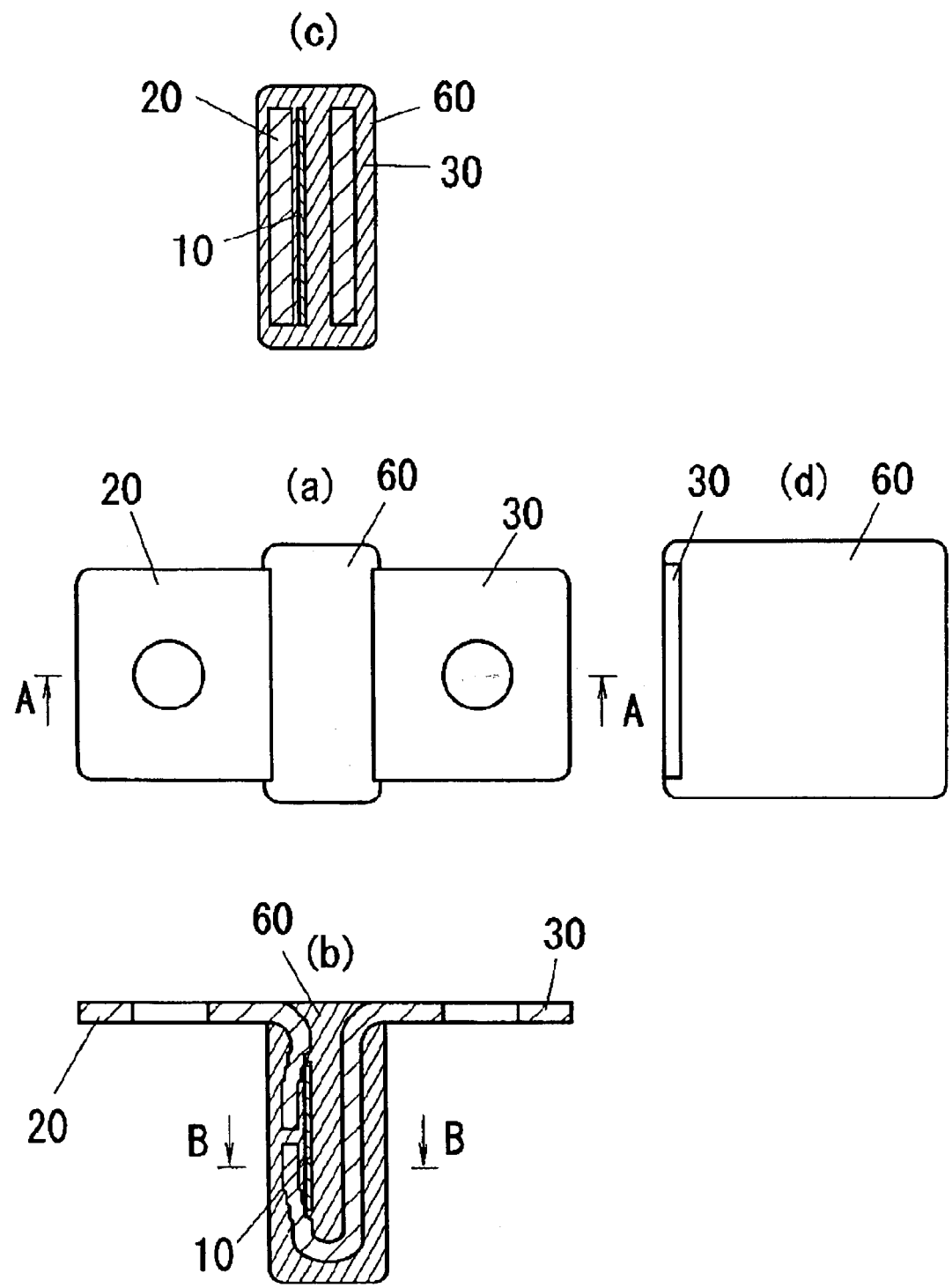
FIG. 3 shows another configuration of the above, wherein (a) is a plan view thereof, (b) is a cross-sectional view along the line A—A of (a), (c) is a cross-sectional view along the line B—B of (b), and (d) is a side view thereof.

The configuration may be of a so-called resin molded type by molding integrally the resistor 10, the end portion 21 of the first fixed terminal plate 20, and the connection portion 33 and the end portion 31 of the second fixed terminal plate 30 with a plastic molded portion 60, as shown in FIG. 3, to hinder ambient environmental influences such as the temperature and humidity.

Figure 4:
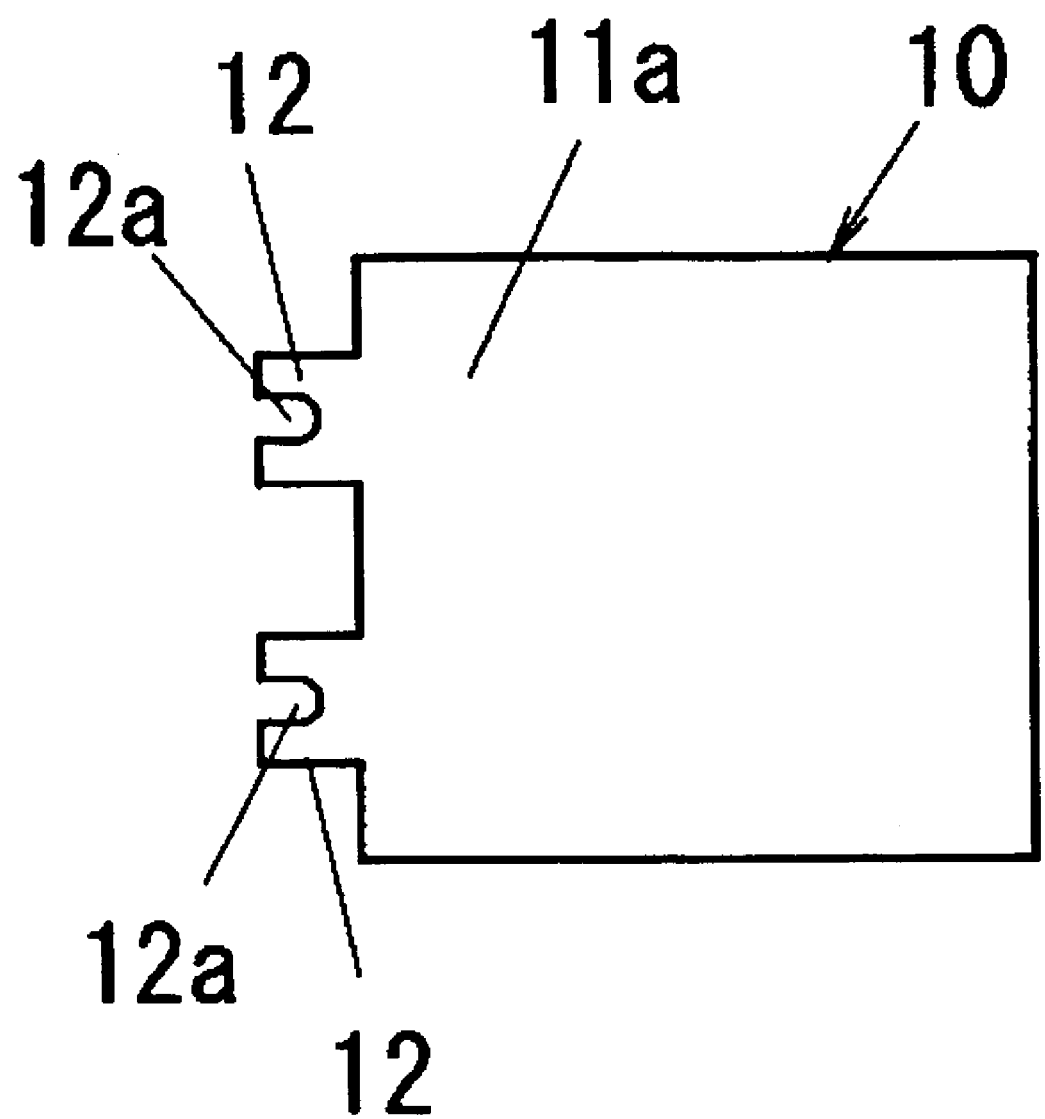
FIG. 4 is a plan view of a resistor having another configuration in the above.

Alternatively, as shown in FIG. 4, the configuration may be such that substantially U-shaped cutouts 12a are individually formed in the terminal tabs 12 and 12 of the resistor 10, the lead wires 40 are inserted into the cutouts 12a and caulked thereat, and thereby, the lead wires 40 are individually connected to the terminal tabs 12. According to this configuration, the individual lead wires 40 can easily be connected to the terminal tabs 12, in comparison to a case where they are connected by, for example, laser welding or resistance welding.

Embodiment 2

Hereinbelow, embodiment 2 of the present invention will be described with reference to FIGS. 5 and 6. The basic configuration of the present embodiment is common to embodiment 1 except for a second fixed terminal plate 50 having a different structure. The common configuration portions are designated by the same reference numerals/symbols, and descriptions thereof are omitted herefrom.

Figure 5:
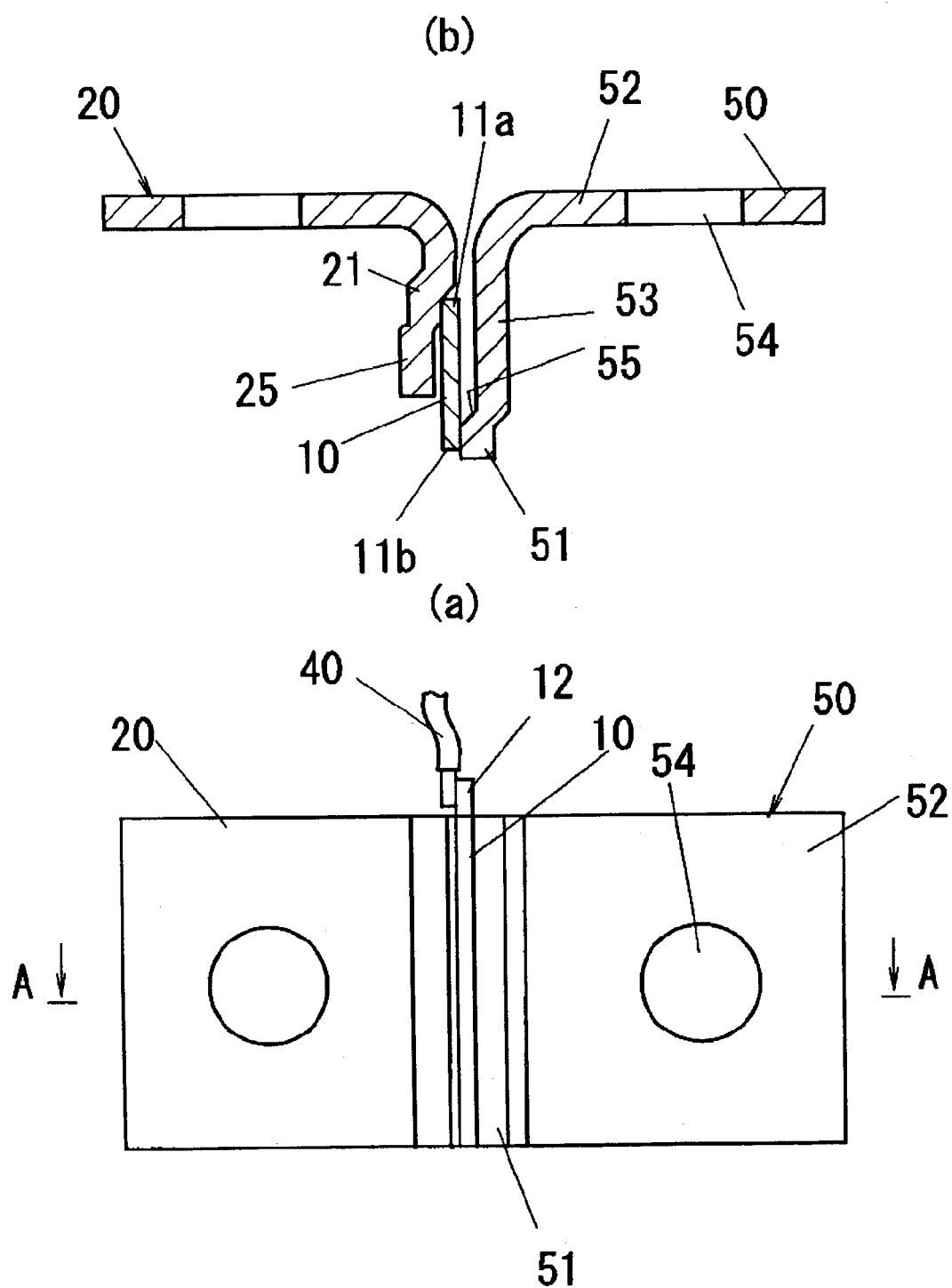
FIG. 5 shows embodiment 2, wherein (a) is a plan view thereof, and (b) is a cross-sectional view along the line A—A of (a)
Figure 6:
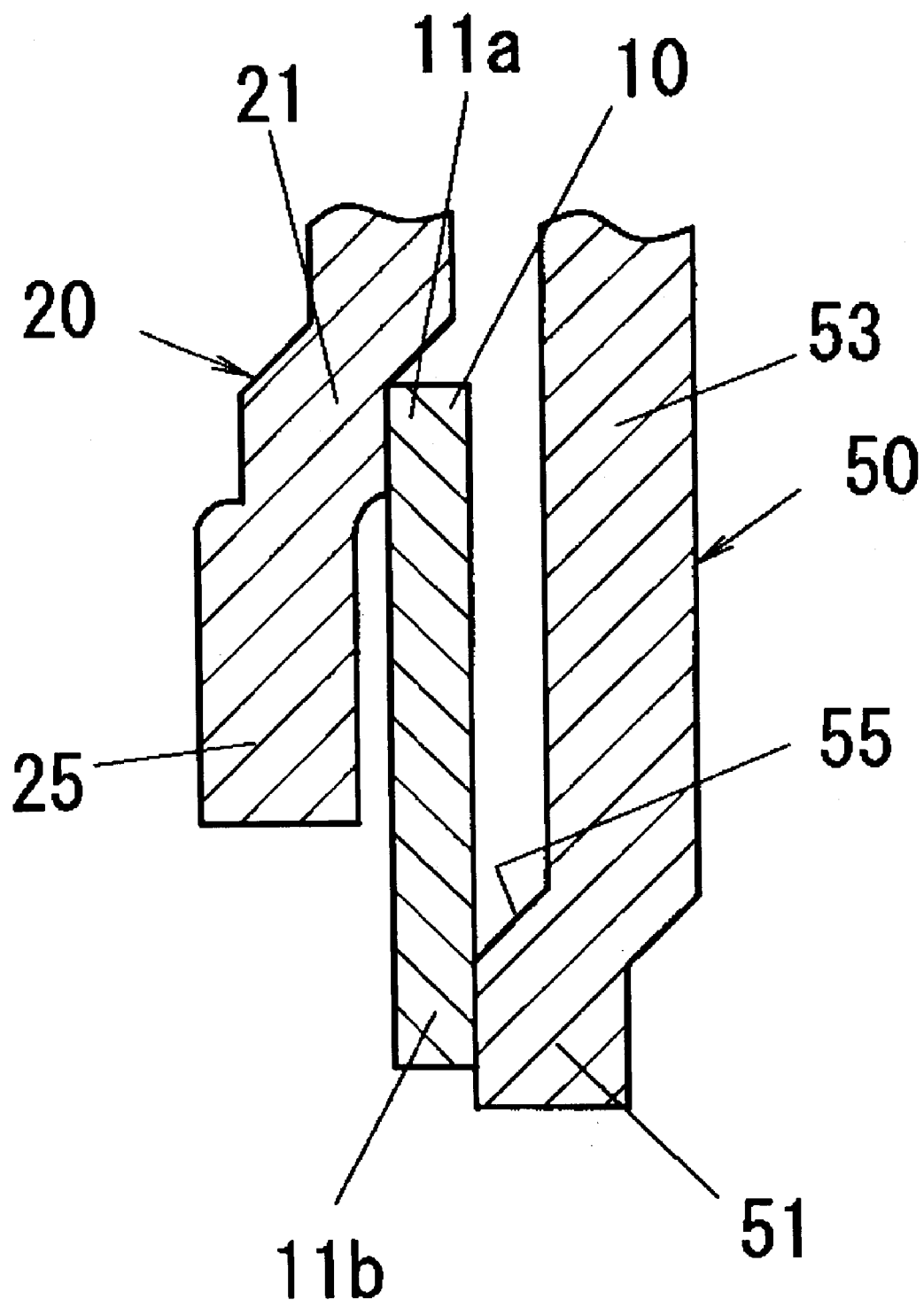
FIG. 6 is a side cross sectional view of essential portions of the above.

Referring to FIG. 5, in the second fixed terminal plate 50 of the present embodiment, a plate material made of an electroconductive metal material such as an electrolytic copper or an HSM (EF-TEC4) is bent substantially in the shape of the letter "L", and a planar main portion 52 and a connection portion 53 that is substantially perpendicular to the main portion 52 are integrally formed. In addition, an end portion of the connection portion 53 is used as an end portion 51 that is connected to the resistor 10. Further, a circular insertion opening 54 is provided substantially in the center of the main portion 52 to allow a fixing screw (not shown) to be inserted. On the other hand, an indented portion 55 retractable toward the main portion 52 is provided between the end portion 51 and the connection portion 53. Then, as shown in FIG. 6, the end portion 51 of the second fixed terminal plate 50 is soldered to the edge portion 11b of the resistor 10.

Thus, the present embodiment has the configuration in which the end portion 51 of the second fixed terminal plate 50 is connected to an opposite face onto which the end portion 21 of the first fixed terminal plate 20 for the resistor 10 is connected and the indented portion 55 is provided between the end portion 51 and the connection portion 53 to secure the clearance between itself and the resistor 10. Hence, the clearance between the resistor 10 and the second fixed terminal plate 50 (connection portion 53) can be narrowed in comparison to the configuration of embodiment 1, in which the connection portion 33 in the vicinity of the end portion 31 which is connected to the edge portion 11a of the resistor 10 is bent substantially in the shape of the letter "U". Accordingly, in comparison to embodiment 1, the inductance component of the shunt resistance is further reduced, and detection errors of the measurement-target current can be further reduced. Moreover, it is not necessary that the second fixed terminal plate 30 is bent substantially in the shape of the letter "U" different from embodiment 1, and therefore, the configuration is advantageous in that manufacturing steps can be simplified, and miniaturization can be implemented by reducing the height of the connection portion 53 of the second fixed terminal plate 50 that is along the direction perpendicular to the longitudinal direction of the resistor 10.

Embodiment 3

The basic configuration of the present embodiment is common to embodiment 2 except for a configuration in which a resistor 10 is positioned with respect to an end portion 21 of a first fixed terminal plate 20. The common configuration portions are designated by the same reference numerals/symbols, and descriptions thereof are omitted herefrom.

Figure 7:
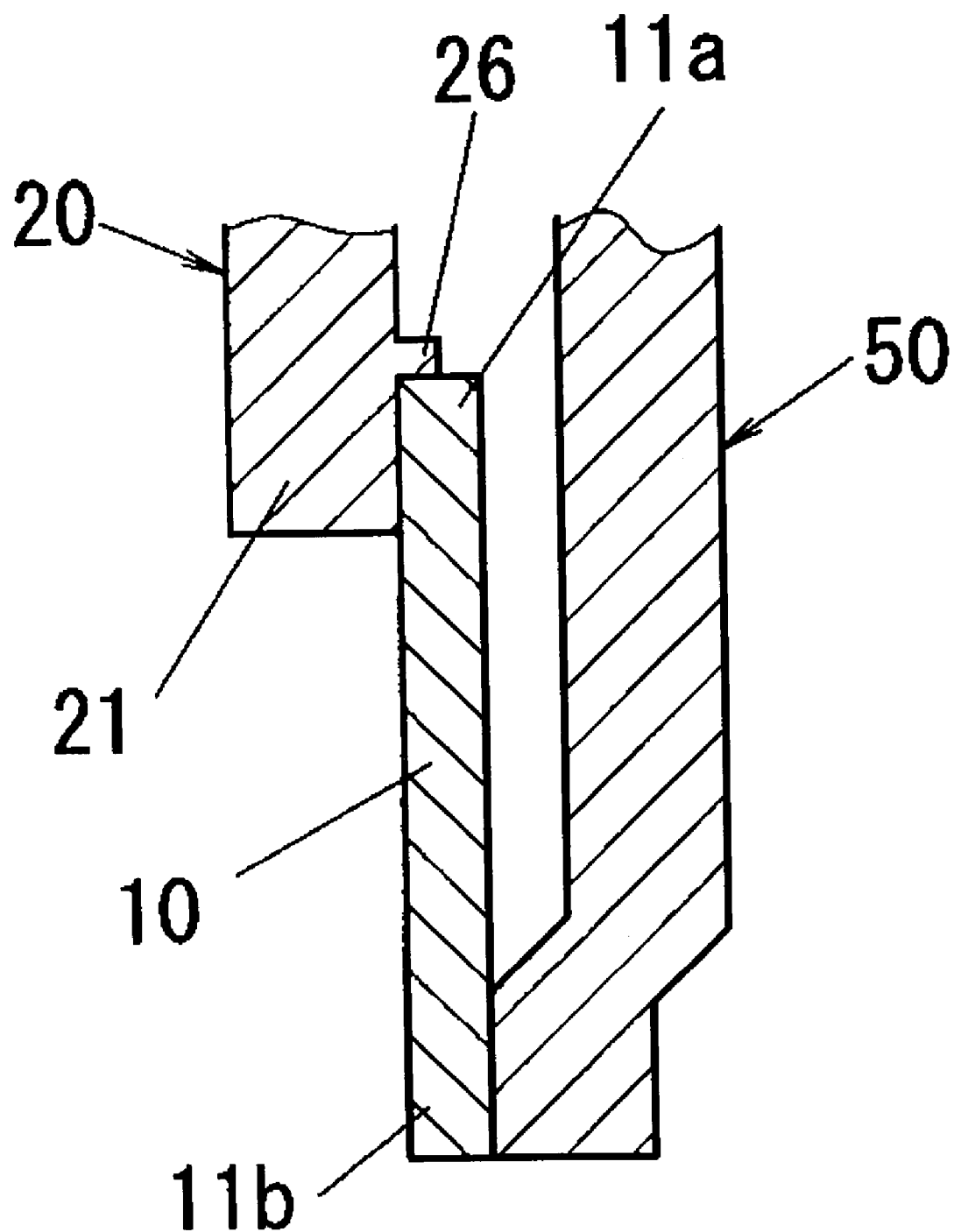
FIG. 7 is an essential-portion side cross sectional view of embodiment 3.

Referring to FIG. 7, in the present embodiment, instead of providing an indented portion 24, a protrusion 26 for positioning is provided on a face onto which the resistor 10 at the end portion 21 is connected. As shown in FIG. 7, the edge portion 11a of the resistor 10 is abutted on the protrusion 26 provided at the end portion 21, and the resistor 10 is thereby positioned to the end portion 21 of the first fixed terminal plate 20 and the connection position with respect to the end portion 21 of the resistor 10 can be stabilized.

Figure 8:
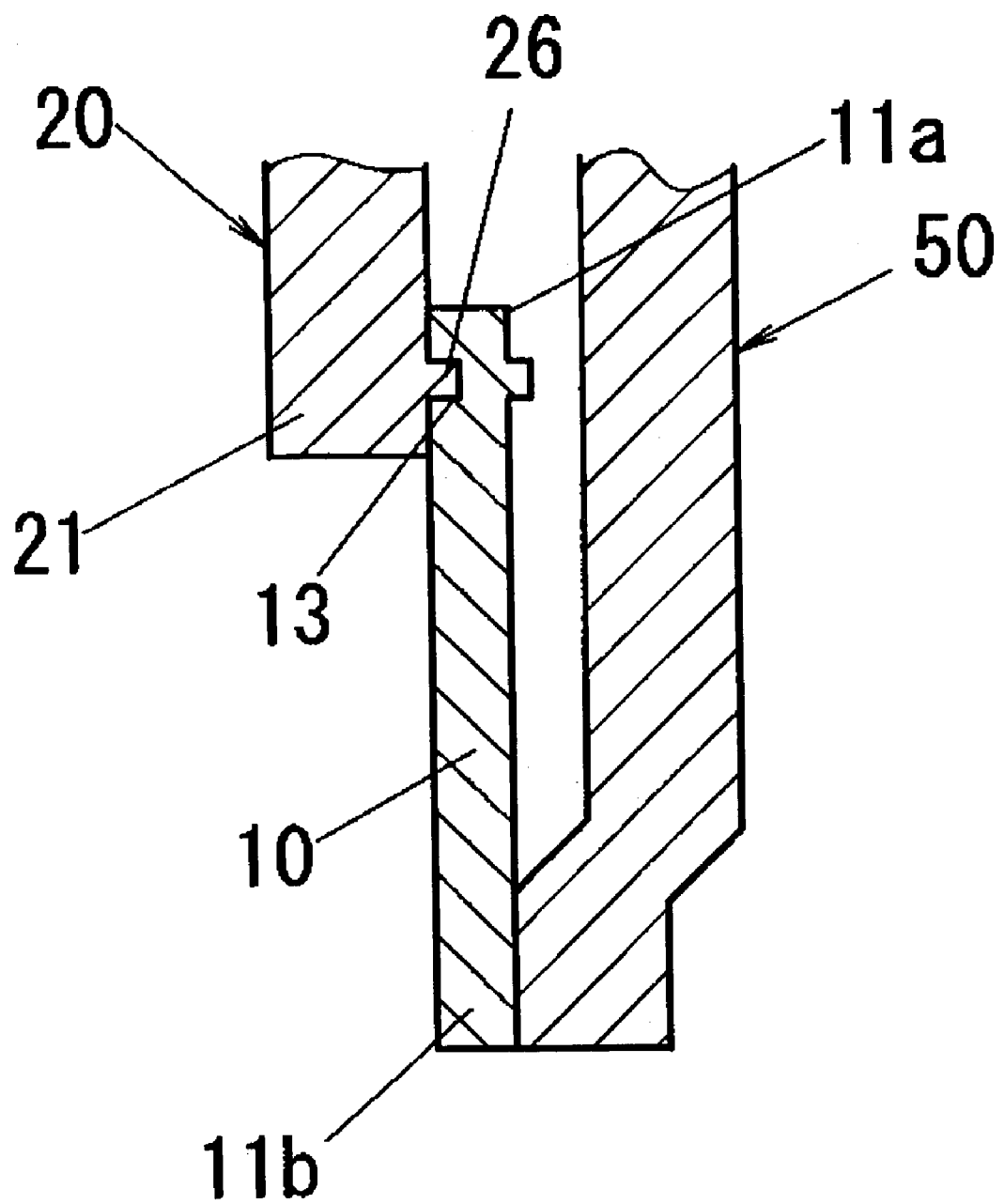
FIG. 8 is an essential-portion side cross sectional view of another configuration of the above.

Alternatively, as shown in FIG. 8, the configuration may be such that an engagement concave 13 engageable with the protrusion 26 is formed at the edge portion 11a of the resistor 10 and the protrusion 26 is engaged with the engagement concave 13 to perform positioning, and thereby, the positioning can be more accurately performed.

Figure 9:
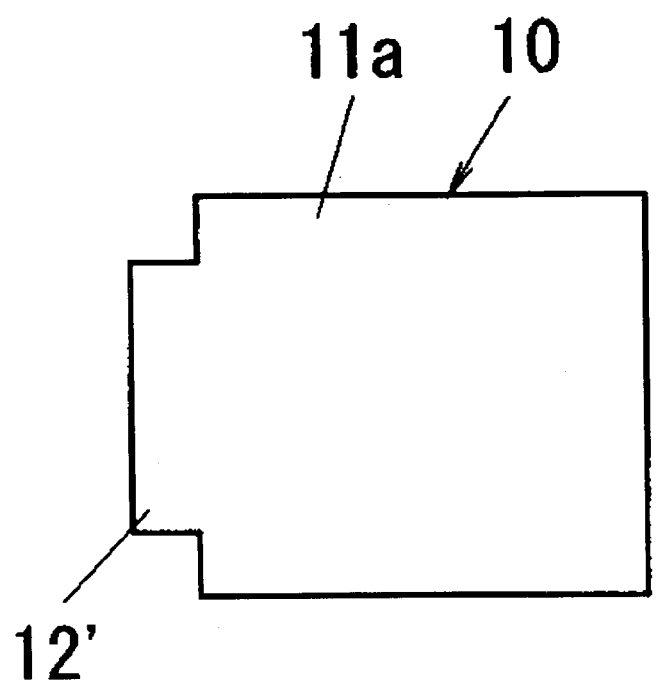
FIG. 9 is a plan view of a resistor having another configuration in the above.

In the individual embodiments 1 to 3, the two terminal tabs 12 and 12 are provided to the resistor 10, and the lead wires 40 and 40 are individually connected to the terminal tabs 12 and 12. However, since the thermal capacity of the metal material used to form the resistor 10 is relatively small, there is possibility that the terminal tabs 12 and 12 are melted by heat generated in, for example, laser welding or resistance welding when connecting the lead wire 40. As such, as shown in FIG. 9, a terminal tab 12' to which the individual lead wires 40 and 40 are to be connected may be integrally formed to increase the size of the terminal tab 12', and thereby, there is no possibility that the terminal tab 12' is melted in, for example, the laser welding or resistance welding for connecting the lead wires 40. In addition, since the size of the terminal tab 12' is large, connection positions of the lead wires 40 and 40 can be changed. Consequently, the resistance value of the resistor 10 as viewed from the lead wires 40 and 40 can be adjusted according to the connection position.

Figure 10:
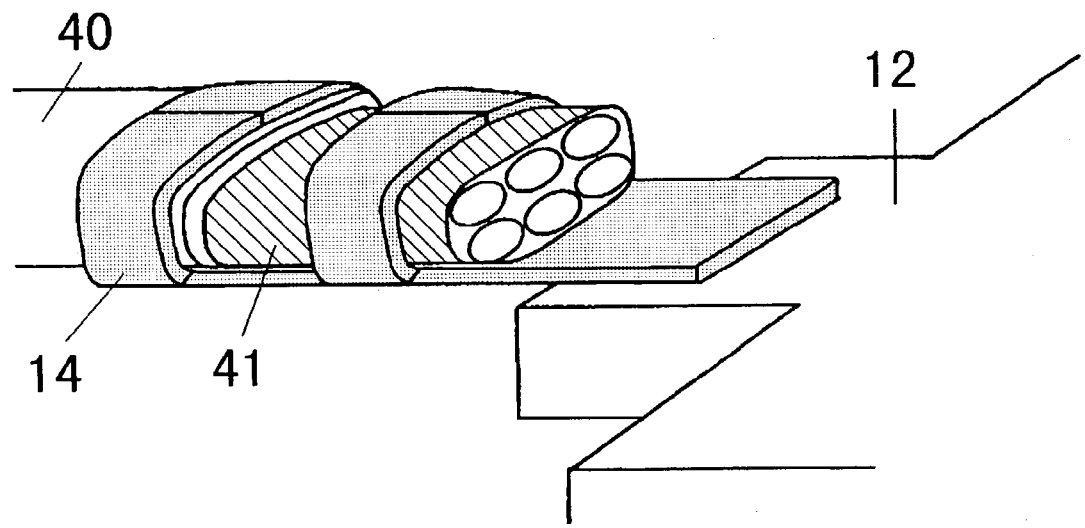
FIG. 10 is a perspective view showing a method of fixing the resistor and a lead wire according to embodiments 1 to 3.
Figure 1:
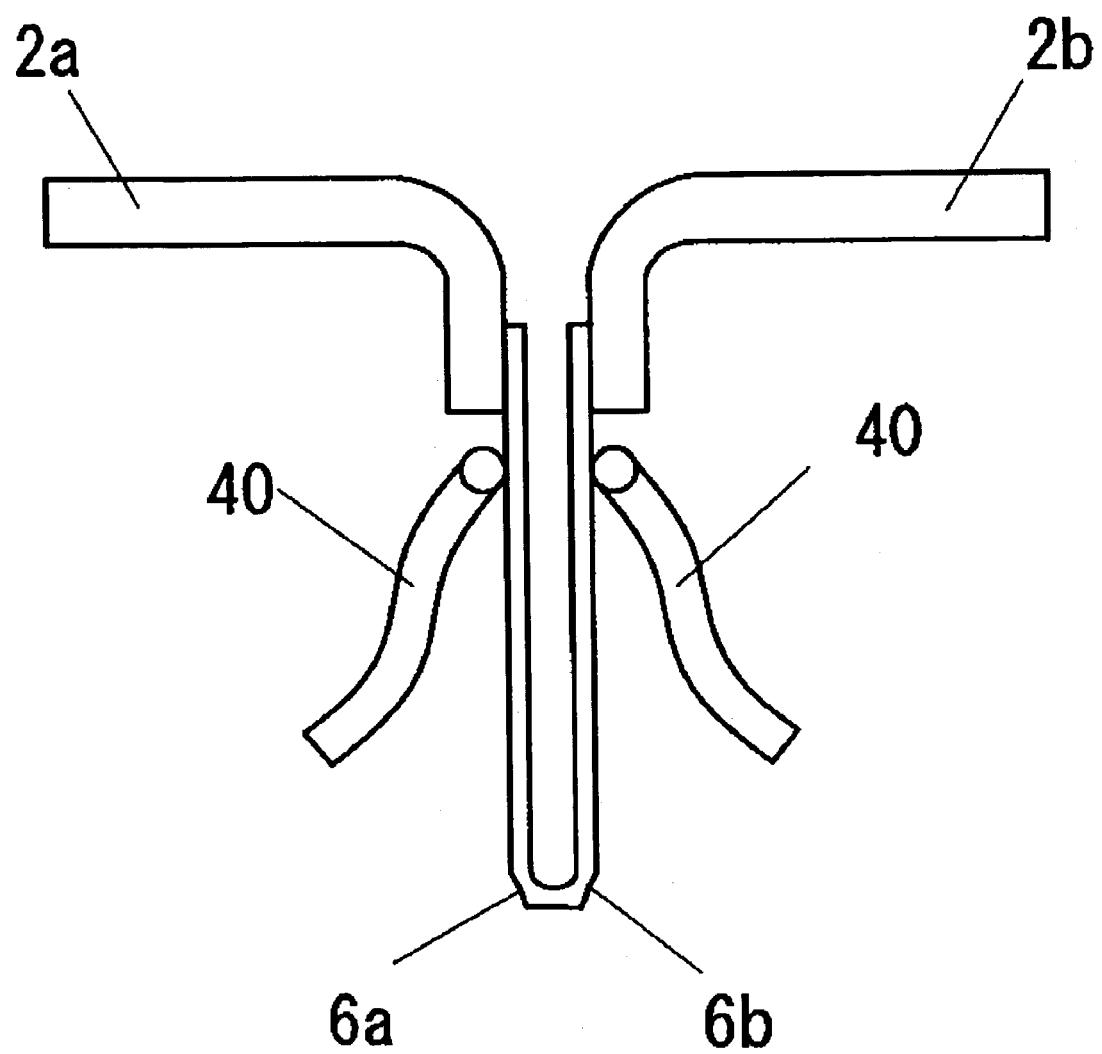

In a configuration in which a brazing filler material is used to fix the lead wire to the terminal tab of the resistor, breakage can occur by vibrations at a boundary between a penetrated portion and an unpenetrated portion of the brazing filler material in an end portion of the lead wire fixed with the brazing filler material. To prevent the breakage, the configuration may be such that, as shown in FIG. 10, the lead wire 40 in which a wire cover has been removed from an end portion 41 is inserted into a wire-cover holding tab terminal 14 and is caulked thereat, and the holding tab terminal 14 is spot-welded to the terminal tab 12. According to this configuration, the strength of a connected portion of the lead wire and the resistor is increased, thereby enabling the lead wire to be prevented from being broken because of, for example, vibrations. In addition, in the configuration arranged such that the end portion 41 of the lead wire 40 is soldered to the holding tab terminal 14, the strength of the connected portion is further increased, and the welded portion is stabilized. Thereby, the reliability of the connected portion can be improved.

While the preferred embodiments of the invention has been described above, it is to be understood that the present invention is not thereby limited except for the definitions given in the appended claims, and various modifications may be imparted without departing from the spirit and scope of the present invention.

For example, in the shunt resistor of the present invention, a protrusion for positioning may be provided at a connection portion of at least one of the fixed terminal plates to the resistor. Thereby, a connection position between the resistor and the fixed terminal plate is stabilized, and variations in the resistance value can be suppressed.

In addition, in the shunt resistor of the present invention, an indented portion for positioning may be provided at a connection portion of at least one of the fixed terminal plates to the resistor. Thereby, a connection position between the resistor and the fixed terminal plate is stabilized, and variations in the resistance value can be suppressed. Further, the clearance between the resistor and the fixed terminal plate opposing the resistor can be narrowed by the provision of the indented portion. Thereby, the inductance component can be reduced, and detection errors of the measurement-target current can consequently be reduced.

In addition, in the shunt resistor of the present invention, terminal tabs may be provided protrusive from a side edge positioned inward of portions connected to the first fixed terminal plate and the second fixed terminal plate of the resistor. In this case, the resistance value of the resistor is more stabilized than in the case where the terminal tabs are provided protrusive from the edge portion.

Moreover, in the shunt resistor of the present invention, a heat-dissipating plate may be provided in the vicinity of the connection portion of at least one of the fixed terminal plates to the resistor. Thereby, heat generated in the resistor through which the measurement-target current flows can efficiently be dissipated, and a temperature rise can consequently be suppressed.

Further, in the shunt resistor of the present invention, a plurality of terminal tabs may be formed integrally, and the size of the terminal can thereby be increased. In this case, for example, the connection portion can be prevented from being melted in laser welding, resistance welding or the like. In addition, the resistance value of the resistor as viewed from the lead wire can be adjusted by changing the connection position of the lead wire.

Further, in the shunt resistor of the present invention, the configuration may be such that an end portion of the lead wire is caulked and fixed using a terminal for connection including a cover holder, and the terminal for connection is fixed to the terminal tab of the resistor. In this case, the strength of the connection portion between the lead wire and the resistor is increased; and consequently, the reliability of the connection portion is improved.

Furthermore, in the shunt resistor of the present invention, a cutout for caulking and fixing the lead wire to an end portion of the terminal tab may be formed. This arrangement facilitates connection of the lead wire to the terminal tab.

Still furthermore, according to the resistance-value adjusting method for the shunt resistor according to the present invention, the resistance value can be adjusted by deleting a certain portion(s) where the terminal tabs of the resistors are not provided. This enables the resistance value of the resistor to easily be adjusted.

INDUSTRIAL APPLICABILITY

A shunt resistor of the present invention as defined in claim 1 has a configuration including a substantially planar resistor having a predetermined resistance value; a first fixed terminal plate that has one end portion connected to an edge of the resistor; and a second fixed terminal plate that has one end portion connected to the other edge of the resistor, that has a portion in the vicinity of the end portion which is bent substantially in the shape of the letter "U", and that opposes the resistor and at least a portion of the first fixed terminal plate, wherein a plurality of terminal tabs for taking a voltage drop in the resistor as a voltage signal is provided protrusive from a side edge of the resistor. Thus, since the terminal tabs are provided protrusive from the side edge of the resistor, the shunt resistor has an effect that even in a case where, for example, a lead wire is connected to each of the terminal tabs, the lead wire can be extended in a direction different from the direction of a sidewall of the resistor; and accordingly, the structural restriction can be avoided, and the degree of freedom in design can therefore be enhanced.

A shunt resistor of the present invention as defined in claim 2 has a configuration including a substantially planar resistor having a predetermined resistance value; a first fixed terminal plate that has one end portion connected to an edge of the resistor; and a second fixed terminal plate that has one end portion connected to the other edge of the resistor and that opposes the resistor and at least a portion of the first fixed terminal plate, wherein a plurality of terminal tabs for taking a voltage drop in the resistor as a voltage signal is provided protrusive from a side edge of the resistor. Thus, since the terminal tabs are provided protrusive from the side edge of the resistor, the shunt resistor has an effect that even in a case where, for example, a lead wire is connected to each of the terminal tabs, the lead wire can be extended in a direction different from the direction of a sidewall of the resistor; and accordingly, the structural restriction can be avoided, and the degree of freedom in design can therefore be enhanced. Further, the shunt resistor has an effect that since the clearance between the resistor and the second fixed terminal plate can be narrowed, the inductance component can be reduced, and detection errors of the measurement-target current can consequently be reduced.

In the shunt resistor of the present invention as defined in one of claims 1 and 2, a protrusion for positioning is provided at a connection portion of at least one of the fixed terminal plates to the resistor. Therefore, the shunt resistor has an advantage in that a connection position between the resistor and the fixed terminal plate is stabilized, and variations in the resistance value can consequently be suppressed.

In addition, in the shunt resistor of the present invention as defined in one of claims 1 and 2, an indented portion for positioning is provided at a connection portion of at least one of the fixed terminal plates to the resistor. Hence, the shunt resistor has an advantage in that a connection position between the resistor and the fixed terminal plate is stabilized, and variations in the resistance value can consequently be suppressed. Further, the shunt resistor exhibits an advantage in that since the indented portion is provided, the clearance between the resistor and the fixed terminal plate opposing the resistor can be narrowed, the inductance component can be reduced, and detection errors of the measurement-target current can consequently be reduced.

Further, in the shunt resistor of the present invention as defined in one of claims 1 and 2, the terminal tabs are provided protrusive from a side edge positioned inward of portions connected to the first fixed terminal plate and the second fixed terminal plate. In this case, the resistance value of the resistor is more stabilized than in the case where the terminal tabs are provided protrusive from the edge portion.

Further, in the shunt resistor of the invention as defined in one of claims 1 and 2, a heat-dissipating plate is provided in the vicinity of the connection portion of at least one of the fixed terminal plates to the resistor. Therefore, the shunt resistor has an effect that heat generated in the resistor through which the measurement-target current flows can efficiently be dissipated, and a temperature rise can consequently be suppressed.

Further, in the shunt resistor of the present invention as defined in one of claims 1 and 2, since the plurality of terminal tabs is formed integrally, the shunt resistor has an effect that the size of the terminal can be increased. For example, the connection portion can be prevented from being melted in laser welding, resistance welding or the like, and in addition, the resistance value of the resistor as viewed from the lead wire can be adjusted by changing the connection position of the lead wire.

Further, in the shunt resistor of the present invention as defined in one of claims 1 and 2, an end portion of the lead wire is caulked and fixed using a terminal for connection including a wire-cover holder, and the terminal for connection is fixed to the terminal tab of the resistor. Hence, the strength of the connection portion between the lead wire and the resistor is increased, and the reliability of the connection portion is consequently improved.

Further, in the shunt resistor of the present invention as defined in one of claims 1 and 2, since a cutout for caulking and fixing the lead wire to an end portion of the terminal tab is formed, connection of the lead wire to the terminal tab is facilitated.

Furthermore, in a resistance-value adjusting method for the shunt resistor of the present invention as defined in one of claims 1 and 2, the resistance value is adjusted by deleting a certain portion where the terminal tab of the resistor is not provided. Therefore, the shunt resistor has an effect that the resistance value of the resistor can easily be adjusted.

The invention claimed is:

1. A shunt resistor comprising:
   a planar resistor element having a first longitudinal edge portion, a second longitudinal edge portion, side portions extending between the first and second longitudinal edge portions, and a plurality of terminals protruding from one of said side portions, wherein said planar resistor element is dimensioned to provide an electrical resistance between said terminals;
   a first fixed terminal plate having an end portion extending parallel to said planar resistor element, wherein said end portion of said first fixed terminal plate is conductively connected to said first longitudinal edge portion of said planar resistor element, said end portion of said first fixed terminal plate further comprising a protrusion cooperatively engaging said planar resistor element to position said planar resistor element relative to said first fixed terminal plate; and
   a second fixed terminal plate extending parallel to said planar resistor element between said first longitudinal edge portion and said second longitudinal edge portion, said second fixed terminal plate including an end portion conductively connected to said second longitudinal edge portion of said planar resistor element.

2. The shunt resistor according to claim 1 wherein said protrusion abuts said first longitudinal edge portion.

3. The shunt resistor according to claim 1 wherein said protrusion engages with a concave portion in said resistor.

4. A shunt resistor comprising:
   a planar resistor element having a first longitudinal edge portion, a second longitudinal edge portion, side portions extending between the first and second longitudinal edge portions, and a plurality of terminals protruding from one of said side portions, wherein said planar resistor element is dimensioned to provide an electrical resistance between said terminals;
   a first fixed terminal plate having an end portion extending parallel to said planar resistor element, wherein said end portion of said first fixed terminal plate is conductively connected to said first longitudinal edge portion of said planar resistor element, said end portion of said first fixed terminal plate further comprising a protrusion cooperatively engaging said planar resistor element to position said planar resistor element relative to said first fixed terminal plate; and a second fixed terminal plate extending parallel to said planar resistor element between said first longitudinal edge portion and said second longitudinal edge portion, said second fixed terminal plate including an end portion conductively connected to said second longitudinal edge portion of said planar resistor element, said second fixed terminal plate further including an indented portion providing a clearance between the second fixed terminal plate and the planar resistor element between said first longitudinal edge portion and said second longitudinal edge portion.

5. The shunt resistor according to claim 4 wherein said protrusion abuts said first longitudinal edge portion.

6. The shunt resistor according to claim 4 wherein said protrusion engages with a concave portion in said resistor.

* * * * *